United States Patent
Guidry et al.

(10) Patent No.: US 7,109,902 B2
(45) Date of Patent: Sep. 19, 2006

(54) METHOD AND SYSTEM FOR SAMPLING A SIGNAL

(75) Inventors: David W. Guidry, Rowlett, TX (US); Sasikumar P. Cherubal, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/881,576

(22) Filed: Jun. 30, 2004

(65) Prior Publication Data
US 2006/0001562 A1   Jan. 5, 2006

(51) Int. Cl.
H03M 1/00 (2006.01)
G11C 27/02 (2006.01)
H03K 5/00 (2006.01)
H03K 17/00 (2006.01)

(52) U.S. Cl. .................................. 341/122; 327/94
(58) Field of Classification Search ........... 341/122, 341/118, 120; 327/163, 295, 94; 333/136; 702/79, 75, 117; 714/724; 324/76.11, 76.15, 324/750, 765; 375/226, 354
See application file for complete search history.

(56) References Cited

U.S. PATENT DOCUMENTS

| | | | | |
|---|---|---|---|---|
| 3,267,394 A * | 8/1966 | Peil et al. | .................... | 333/136 |
| 4,425,483 A * | 1/1984 | Lee et al. | ............... | 379/406.06 |
| 4,866,449 A * | 9/1989 | Gaffney | ....................... | 342/151 |
| 5,289,116 A * | 2/1994 | Kurita et al. | ............ | 324/76.11 |
| 5,309,484 A * | 5/1994 | McLane et al. | ............. | 375/354 |
| 5,589,763 A * | 12/1996 | Burns | ....................... | 324/76.15 |
| 5,610,826 A * | 3/1997 | Whetsel | ....................... | 702/117 |
| 5,633,801 A * | 5/1997 | Bottman | ....................... | 702/65 |
| 5,654,657 A * | 8/1997 | Pearce | ........................ | 327/163 |
| 5,710,517 A * | 1/1998 | Meyer | ........................ | 327/163 |
| 5,909,186 A * | 6/1999 | Gohringer | ................... | 341/120 |
| 6,118,284 A * | 9/2000 | Ghoshal et al. | ............ | 324/750 |
| 6,177,894 B1 * | 1/2001 | Yamaguchi | ............... | 341/120 |
| 6,249,240 B1 * | 6/2001 | Bellaouar | ................... | 341/172 |
| 6,324,485 B1 * | 11/2001 | Ellis | .......................... | 702/117 |
| 6,326,909 B1 * | 12/2001 | Yamaguchi | ................. | 341/120 |
| 6,414,621 B1 * | 7/2002 | Lee | ............................. | 341/159 |
| 6,476,742 B1 * | 11/2002 | Yamaguchi | ................. | 341/120 |
| 6,622,107 B1 * | 9/2003 | West | .......................... | 702/117 |
| 6,661,836 B1 * | 12/2003 | Dalal et al. | ................. | 375/226 |
| 6,667,647 B1 * | 12/2003 | Magoshi | ..................... | 327/295 |
| 6,784,686 B1 * | 8/2004 | Nishida et al. | ............. | 324/765 |
| 6,807,498 B1 * | 10/2004 | Premy | .......................... | 702/79 |
| 6,898,746 B1 * | 5/2005 | Jain et al. | ................... | 714/724 |
| 6,904,375 B1 * | 6/2005 | Sabih et al. | ................. | 702/75 |

* cited by examiner

*Primary Examiner*—Patrick Wamsley
(74) *Attorney, Agent, or Firm*—Yingsheng Tung; Wade James Brady, III; Frederick J. Telecky, Jr.

(57) ABSTRACT

According to one embodiment of the invention, a method of sampling a signal is provided. The method includes receiving over a signal path an analog signal generated using a first clock signal by a first device. The method also includes sampling the analog signal using a second clock signal to generate a numeric representation of at least a portion of the analog signal. The frequencies of the first and the second clock signals differ from one another by a known amount. The method also includes communicating over the signal path the numeric representation for receipt by a second device. The signal path experiences loading and at least a majority of the loading of the signal path occurs between the sampler and the second device.

19 Claims, 2 Drawing Sheets

METHOD AND SYSTEM FOR SAMPLING A SIGNAL

TECHNICAL FIELD OF THE INVENTION

This invention relates generally to electronics and more particularly to a method and system for sampling a signal.

OVERVIEW

Communicating signals between devices may be a challenge depending on the distance between the devices, signal strength, and the frequency of the signal that is being communicated. For example, when testing a high-frequency electronic device, such as a universal serial bus (USB) 2.0, the frequency of the signal transmitted by USB 2.0 may exceed the operating speed at which a tester can measure the signal with a requisite level of accuracy for testing. Undersampling may be used to measure high frequency signals at a lower speed, but the equipment generally used for undersampling with a requisite level of accuracy may be expensive.

SUMMARY OF EXAMPLE EMBODIMENTS

According to one embodiment, a method of sampling a signal is provided. The method includes receiving over a signal path an analog signal generated using a first clock signal by a first device. The method also includes sampling the analog signal using a second clock signal to generate a numeric representation of at least a portion of the analog signal. The frequencies of the first and the second clock signals differ from one another by a known amount. The method also includes communicating over the signal path the numeric representation for receipt by a second device. The signal path can experience loading and, in that case, at least a majority of the loading of the signal path occurs between the sampler and the second device.

In another embodiment, a system for sampling analog signals is provided. The system includes a first device operable to generate an analog signal using a first clock signal. The system also includes a sampler operable to receive over a signal path the analog signal and to generate a numeric representation of at least a portion of the analog signal using a second clock signal. The frequencies of first and second clock signals differ from one another by a known amount. The system also includes a second device operable to receive over the signal path the numeric representation of the at least a portion of the analog signal. The signal path experiences loading, and at least a majority of the loading of the signal path occurs between the sampler and the second device.

Various embodiments may realize some, none, or all of the following advantages. For example, according to one embodiment, an undersampling technique having an improved level of accuracy is provided by undersampling an analog signal, generating a numeric representation of the analog signal, and communicating the numeric representation to a second device over a portion of the signal path that experiences a majority of the loading of the signal path. In another embodiment, a high frequency signal may be economically undersampled without significantly sacrificing accuracy by using an analog-to-digital converter substantially co-located with the analog signal source, to undersample an analog signal and transmit to a device over a transmission line a numeric representation of the analog signal.

Other advantages may be readily ascertained by those skilled in the art.

BRIEF DESCRIPTION OF THE DRAWINGS

Reference is now made to the following description taken in conjunction with the accompanying drawings, wherein like reference numbers represent like parts, in which.

DETAILED DESCRIPTION OF EXAMPLE EMBODIMENTS

Figure 1:
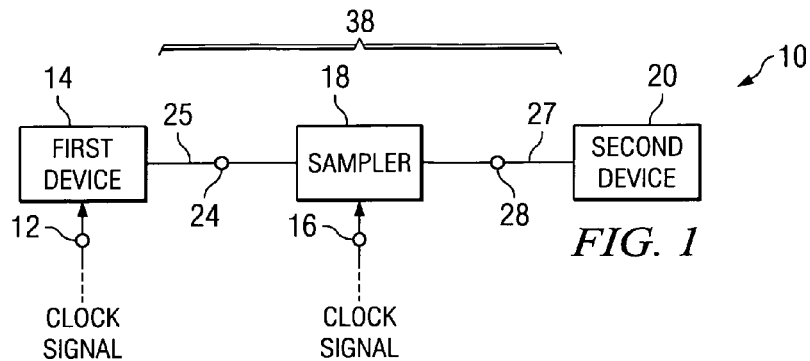
FIG. 1 is a schematic diagram illustrating one embodiment of a system that may benefit from the teachings of the present invention.

FIG. 1 is a schematic diagram illustrating one embodiment of a communications system 10 that may benefit from the teachings of the present invention. System 10 includes a first device 14, a second device 20, and a signal path 38 that couples first device 14 and second device 20. In this document, "coupled" or "couple" refers to any direct or indirect connection between two or more objects. In one embodiment, first device 14 is a device under test (DUT), and second device 20 comprises automatic test equipment (ATE). However, other devices operable to generate an analog signal and to receive a sampled value of that signal could alternatively comprise first device 14 and second device 20, respectively.

Sampler 18 may be any device that is operable to sample an analog signal 24 to generate a numeric representation 28 of that signal. In certain embodiments, sampler 18 may be an analog-to-digital converter having a high speed sample-and-hold circuit. In another example, sampler 18 comprises a flash analog-to-digital converter. Such embodiments may be advantageous in situations where first device 14 generates an analog signal having a high frequency.

Signal path 38 comprises a first portion 25 and a second portion 27. As shown in FIG. 1, first device 14 and sampler 18 respectively receive clock signals 12 and 16 that have different frequencies. Sampler 18 is operable to receive, over first portion 25, analog signal 24 generated in accordance with clock signal 12, to sample the received analog signal using clock signal 16 to generate numeric representation 28, and to transmit numeric representation 28 to second device 20 over second portion 27 of signal path 38.

In one embodiment, clock signal 12 received by first device 14 and clock signal 16 received by sampler 18 may have frequencies that are different from one another by a known amount. Such a difference may be desirable when sampler 18 is undersampling an analog signal having a frequency that exceeds the real-time sampling capability of sampler 18.

In some situations, signal path 38 experiences a level of loading that may distort a signal transmitted over signal path 38. "Loading" can refer to, for example, resistance, capacitance, inductance, impedance, and/or any other factor that alters a characteristic of a signal transmitted over signal path 38. According to one embodiment, sampler 18 is provided in first portion 25 of signal path 38 so that a majority of the loading of signal path 38 is experienced in second portion 27 of signal path 38 between sampler 18 and second device 20. Sampler 18 receives analog signal 24 and generates a numeric representation 28 of analog signal 24. Numeric representation 28 is transmitted over second portion 27 of signal path 38 experiencing a majority of the loading.

Arranging the location of sampler 18 with respect to portions of signal path 38 most likely to experience the majority of the loading can provide an advantage of sampling analog signal 24 before the analog signal experiences signal distortion, thus allowing a more accurate sampling of the analog signal 24. In some embodiments, the length of first portion 25 can be limited to, for example, no more than ¹⁄₁₀, ¹⁄₂₅, or ¹⁄₅₀ of the length of the center wavelength of the signal being communicated. This can help to provide a lumped connection between first device 24 and sampler 18. This can also assist in providing an embodiment where a portion of signal path 38 that operates as a transmission line resides at a location after numeric representation 28 has been generated by sampler 18.

In some embodiments, the portion of signal path 38 experiencing a majority of the loading, such as second portion 27, experiences sixty percent, seventy percent, eighty percent, ninety percent, or greater than ninety percent of the loading. In one embodiment, greater than ninety five percent of the loading of signal path 28 is experienced by second portion 27.

Figure 2:
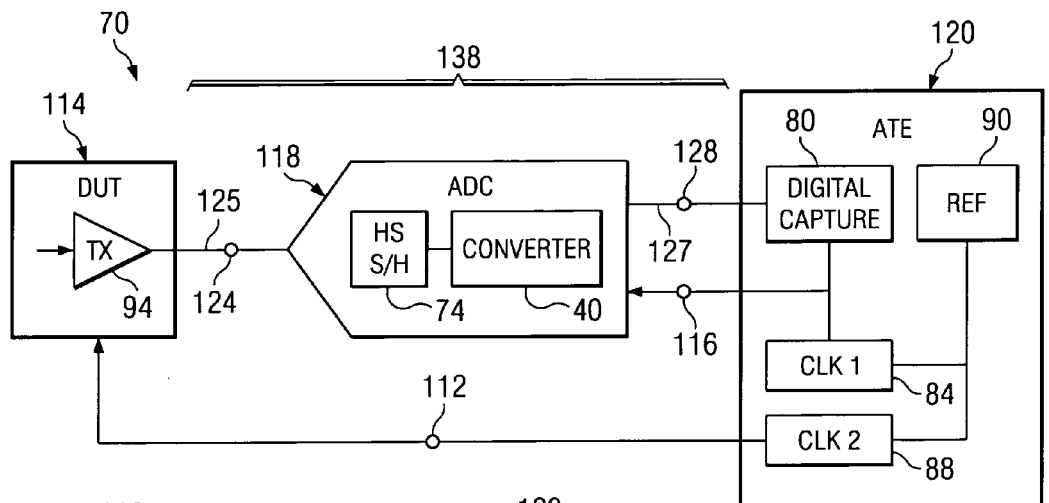
FIG. 2 is a schematic diagram illustrating another embodiment of a system configured to conduct a test using various sampling techniques.
Figure 2A:
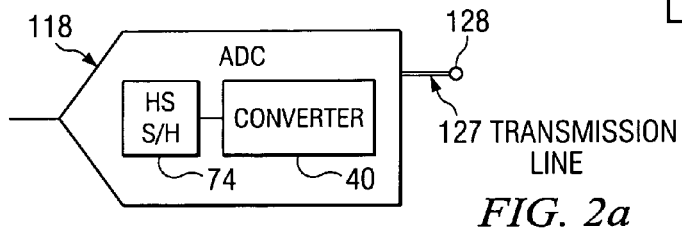
FIG. 2A is a schematic diagram illustrating the system depicted in FIG. 2 with a portion of the signal path operating as a transmission line.

FIG. 2 is a schematic diagram illustrating one partial embodiment of a system 70 operable to sample an analog signal. As an example, in one embodiment of system 70 shown in FIG. 2, a first device 114 is a DUT 114 having a transmit amplifier 94, and a second device 120 is an ATE 120 having a digital capture device 80, a clock 84, a clock 88, and a reference clock 90. However, devices 114 and 120 are not limited to being DUT 114 and ATE 120, respectively. In one embodiment of system 70 shown in FIG. 2, a sampler 118 is an analog-to-digital converter having a high speed sample-and-hold circuit 74 and a conversion unit 40.

As shown in FIG. 2, reference clock 90 is coupled to clocks 84 and 88 of device 120. Clock 84 is coupled to digital capture device 80 and sampler 118. Clock 88 is coupled to first device 114. Digital capture device 80 is coupled to converter 40 of sampler 118 over a second portion 127 of signal path 138. Digital capture device 80 is operable to receive signals 128 from sampler 118 and to record the signals for different uses, such as testing of first device 114.

In one embodiment, reference clock 90 is operable to provide a reference clock signal to both clocks 84 and 88. In this example, clocks 84 and 88 are each operable to receive the reference clock signal and to multiply the reference clock signals by a known amount. For example, clock 88 is operable to multiply a reference clock signal of 24 megahertz by 148 and to provide the multiplied clock signal as a clock signal 112 to first device 114. Clock 84 may be operable to multiply the reference clock signal by 148.001, and to provide the multiplied clock signal as a clock signal 116 to sampler 118. Other methods of generating offset clock frequencies could be used. Using clocks 84 and 88 that can provide multiple clock signals that reference a common clock signal is advantageous in certain embodiments because the difference between clock signals 112 and 116 is precisely maintained regardless of signal drift.

A sampler 118, in this example, comprises a sample-and-hold circuit 74 coupled to a converter 40. Sample-and-hold circuit 74 is operable to sample an analog signal 124 received over a first portion 125 of a signal path 138 using a suitable clock signal, such as a clock signal 116. In one embodiment, clock signal 116 used to sample the analog signal is provided by clock 84; however, any clock signal having a suitable frequency may be provided to sample-and-hold circuit 74 for performing a sampling of an analog signal. In one embodiment, sample-and-hold circuit 74 is a high speed sample-and-hold circuit 74. Converter 40 is operable to convert the results of the sampling performed by circuitry 74 into appropriate numerical representations 128.

Although sampler 118 is shown as having sample-and-hold circuit 74, in some embodiments, sampler 118 may not include such circuitry. For example, in some embodiments, converter 40 may be a flash converter that does not include a high-speed sample-and-hold circuit 74 to sample the analog signal from device 114. In another embodiment, converter 40 may be a digitizer. Although FIG. 2 shows the use of two clocks 84 and 88, one of the clocks 84 or 88 may be omitted, for example, when system 10 uses a swept delay generator to generate a difference of frequency between the two clock signals provided to device 14 and sampler 18, respectively.

In one embodiment, a second portion 127 of signal path 138 operates as a transmission line and has a length that exceeds one foot. In one embodiment, first portion 125 operates as a lumped connection, and thus there is very little loading experienced within first portion 125. In one particular embodiment, first portion 125 has a length that is less than or equal to one-tenth of a center wavelength of the analog signal transmitted by device 114 to sampler 118. In a particular embodiment, the length of first portion 125 of path 138 is one-twenty-fifth or even one-fiftieth or less of a center wavelength of the analog signal transmitted by device 114 to sampler 118. In certain embodiments, first portion 125 is less than one foot.

In some embodiments, second portion 127 may comprise a plurality of parallel connections between sampler 118 and device 120. For example, a plurality of transmission lines may couple sampler 118 and device 120 in parallel. This is advantageous in some embodiments because the transfer speed of numeric representation 128 from sampler 118 to device 120 is increased.

In operation, device 114 transmits analog signal 124 using amplifier 94 over first portion 125 to sampler 118. In an example where device 114 is a USB 2.0 device having a transmission speed of, for example, 480 megabits per second, the analog signal transmitted using amplifier 94 may have a frequency of approximately 240 megahertz. At such a frequency, it is described that the analog signal rises from zero to 90 percent of the full height of the square wave within approximately 500 picoseconds for a square wave. Because such a frequency is often beyond the sampling capabilities of many types of testing equipment, analog signal 124 from device 114 may advantageously be undersampled using a clock speed having a lower frequency. As such, reference clock 90 may provide a clock signal having a frequency of, for example, 24 megahertz, which is generally within the capabilities of most test equipment. Thus, if one hundred points are desired to produce a representation of the analog signal that has a requisite level of accuracy, the analog signal is sampled in every five picoseconds.

To allow the sampling of the analog signal at five-picosecond time intervals, the clock signals provided to device 114 and sampler 118 can be, for example, approximately 0.0005 megahertz different from each other. Thus, clock 84 may multiply the reference clock signal having a frequency of 24 megahertz by ten to provide clock signal 116 having 240 megahertz to both sampler 118 and digital capture device 80. Clock 88 may multiply the same reference clock signal having a frequency of 24 megahertz by approximately 10.0000208 to provide clock signal 12 having a frequency of 240.0005 megahertz to device 14. Then high speed sample-and-hold circuit 74 samples analog signal 124 using clock signal 112 having a frequency of 240 megahertz and holds the results of the sampling for converter 40 to convert into numeric representation 128. Sampler 118 then transmits the numeric representation 128 over second portion 127 to digital capture device 80, which, in this example, is also operating using the same clock signal as sampler 118. Because the results of the sampling are in a digital format, and a majority of the loading experience by signal path 138 is over second portion 127, there is little signal degradation between device 114 and device 120.

Figure 3:
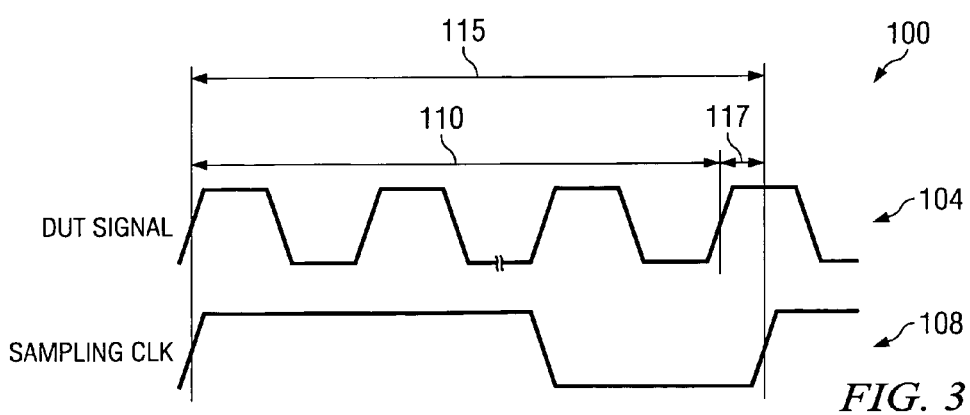
FIG. 3 is a schematic diagram illustrating example frequencies of clock signals provided to a device under test (DUT) and an analog-to-digital converter.

FIG. 3 is a schematic diagram illustrating an example frequency difference between the operating frequency of a device generating an analog signal and the frequency at which a sampler samples the analog signal. As shown in FIG. 3, a wave 104 represents the operating frequency of the analog device, and a wave 108 represents the sampling frequency of the sampler. The length of time required for wave 104 to complete an integer number of full cycles is indicated by a reference number 110. The length of time required for wave 108 to complete one complete cycle is indicated by a reference number 115. A reference number 117 indicates the time difference between the lengths of time indicated by reference numbers 110 and 115. The difference in time 117 indicates the difference between the frequencies of clock signals provided to the analog device and the sampler. Because of the difference in time 117, the analog signal may be undersampled at a frequency that is within the capability of the sampler and the result of the undersampling may be used to reconstruct an accurate model of the analog signal.

Figure 4:
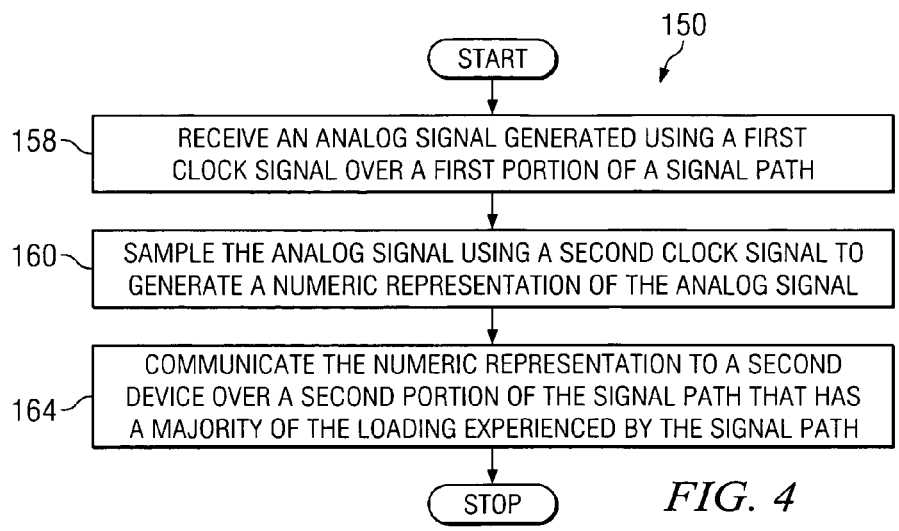
FIG. 4 is a flowchart illustrating one embodiment of a method of sampling a signal.

FIG. 4 is a flowchart illustrating one embodiment of a method 150 of sampling a signal. Some or all acts of method 150 may be implemented using system 10 shown in FIG. 1. However, any suitable device or combination of devices may be used to implement method 150. Features shown in FIG. 2 are used as examples to describe some embodiments of method 150. However, implementation of method 150 is not limited to the description provided below.

Method 150 starts at step 158, where analog signal 124 generated using clock signal 112 provided by clock 88 is received at sampler 118 over first portion 125 of path 138. In one embodiment, first portion 125 of path 138 is a lumped connection. In certain embodiments, first portion 125 of path 138 may have a length less than one tenth, one-twenty-fifth, or one fiftieth of the wavelength of the analog signal. At step 160, sampler 118 samples analog signal 124 using clock signal 116 provided by clock 84. Sampler 118 may conduct the sampling using sample-and-hold circuit 74; however, any suitable device for sampling an analog signal having a particular frequency may be used. Sampler 118 generates numeric representation 128 of the analog signal. Sampler 118 may generate numeric representation 128 using an analog-to-digital conversion device 40; however, other suitable device, such as a digitizer, may be used by sampler 118. In one embodiment, numeric representation 128 may be a multi-bit digital signal. At step 164, numeric representation 128 is communicated to second device 120 over second portion 127 of path 138. Second portion 127 of path 138 experiences a majority of the loading experienced by signal path 138.

Figure 5:
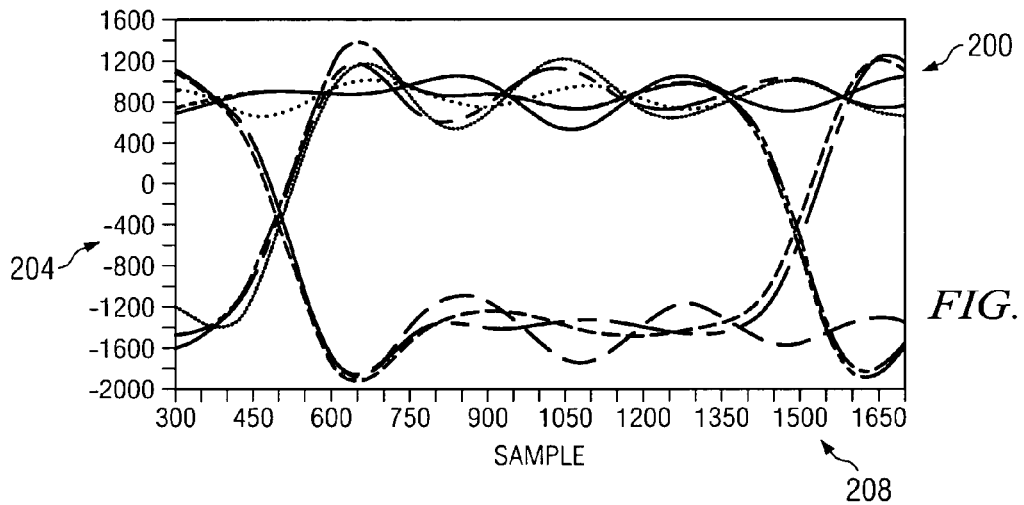
FIG. 5 is a graph illustrating an example result of performing a method of sampling a signal.

FIG. 5 is a graph 200 showing an eye diagram that may result from performing, for example, method 150 shown at FIG. 4 using system 10 shown in FIG. 1. The eye diagram is generated by undersampling a pseudo-random bit stream generated by a commercial pulse generator. Graph 200 comprises an axis 208 indicating the number of samples taken and an axis 204 indicating voltage. A mask-based test can be applied to this data that ensures transmitter performance parameters such as rise time, fall time, jitter, inter-symbol interference, and other parameters.

Figure 6:
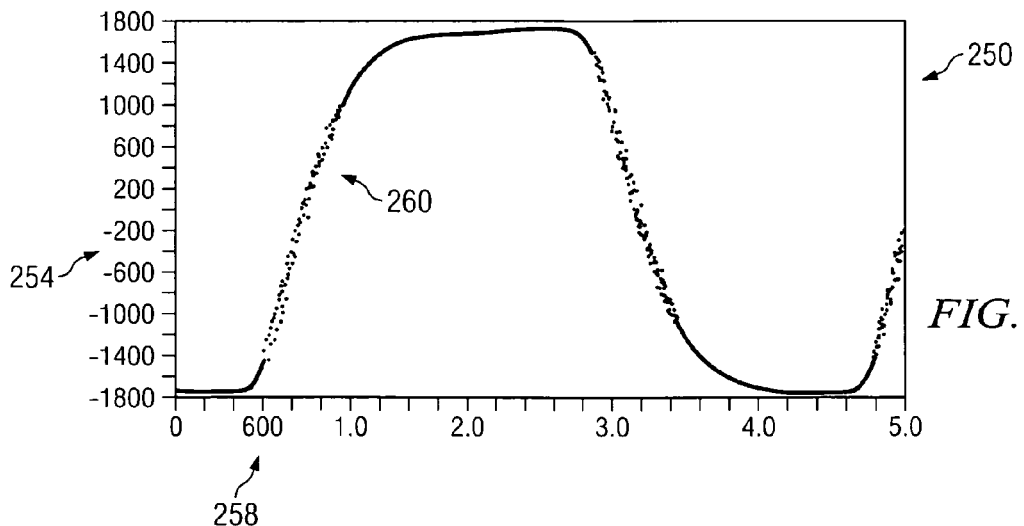
FIG. 6 is a graph illustrating one embodiment of an undersampled square wave that may result from performing a method of sampling a signal.

FIG. 6 is a graph 250 showing an example of a square wave undersampled with an effective sampling rate of over 200 gigahertz ($\Delta T=5$ picoseconds). Graph 250 may be generated using method 150 shown in FIG. 4 implemented using, for example, system 10 shown in FIG. 1. Graph 250 comprises an axis 258 indicating time and an axis 254 indicating voltage. Graph 250 also comprises a curve 260 representing the square wave. As shown in FIG. 6, an analog signal having a frequency of 240.01 megahertz that is undersampled at 40 megahertz yields curve 260 that accurately represents the analog signal and also shows data such as jitter.

Although some embodiments of the present invention have been described in detail, it should be understood that various changes, substitutions, and alterations can be made hereto without departing from the spirit and scope of the invention as defined by the appended claims.

What is claimed is:

1. A system for sampling analog signals, comprising:
 a first device operable to generate an analog signal using a first clock signal;
 a sampler operable to receive over a signal path the analog signal and to generate a numeric representation of at least a portion of the analog signal using a second clock signal, wherein the frequencies of first and second clock signals differ from one another by a known amount; and
 a second device operable to receive over the signal path the numeric representation of the at least a portion of the analog signal;
 wherein the signal path experiences loading and wherein at least a majority of the loading of the signal path occurs between the sampler and the second device.

2. The system of claim 1, wherein the signal path comprises a first connection between the first device and the sampler and a second connection between the sampler and the second device.

3. The system of claim 2, wherein the first connection comprises a length that is less than or equal to one tenth of a center wavelength of the analog signal.

4. The system of claim 3, wherein the second connection operates as a transmission line.

5. The system of claim 1, wherein the first device comprises a device under test.

6. The system of claim 1, wherein the sampler comprises a sample and hold circuit coupled to an analog-to-digital converter.

7. The system of claim 1, wherein the numeric representation comprises a multiple bit digital signal.

8. The system of claim 1, wherein the frequencies of first and the second clock signals differ from one another by an amount sufficient to undersample the analog signal.

9. The system of claim 1, wherein the first clock signal is generated by a first clock and the second clock signal is generated by a second clock, and wherein the first and second clocks operate with reference to a common reference.

10. The system of claim 1, wherein the second device comprises a digital capture device operable to receive and store the numeric representation.

11. A method of sampling a signal, comprising:
receiving over a signal path an analog signal generated using a first clock signal by a first device;
sampling the analog signal using a second clock signal to generate a numeric representation of at least a portion of the analog signal, wherein the frequencies of the first and the second clock signals differ from one another by a known amount; and
communicating over the signal path the numeric representation for receipt by a second device;
wherein the signal path experiences loading and wherein at least a majority of the loading of the signal path occurs between the sampler and the second device.

12. The method of claim 11, wherein the signal path comprises a first connection between the first device and the sampler and a second connection between the sampler and the second device.

13. The method of claim 12, wherein the first connection comprises a length that is less than or equal to one tenth of a center wavelength of the analog signal.

14. The method of claim 13, wherein the second connection operates as a transmission line.

15. The method of claim 11, wherein the device comprises a device under test.

16. The method of claim 11, wherein the sampler comprises a sample and hold circuit coupled to an analog-to-digital converter.

17. The method of claim 11, wherein the frequencies of first and second clock signals differ from one another by an amount sufficient to undersample the analog signal.

18. The method of claim 11, wherein the first clock signal is generated by a first clock and the second clock signal is generated by a second clock, and wherein the first and second clocks operate with reference to a common reference clock.

19. A method of sampling a signal, comprising:
receiving an analog signal over a substantially lumped connection, the analog signal generated using a first clock signal by a device under test;
sampling the analog signal using a second clock signal, wherein the frequencies of the first and the second clock signals differ from one another by a known amount, and wherein the first and the second clock signals are respectively generated by a first clock and a second clock that operate with reference to a common reference clock;
generating a numeric representation of at least a portion of the analog signal using the result of the sampling; and
communicating over a transmission line the numeric representation for receipt by a second device;
wherein the substantially lumped connection and the transmission line both experience loading and wherein the transmission line experiences a higher level of loading than the substantially lumped connection.

* * * * *